US011069268B2

(12) United States Patent
Niu et al.

(10) Patent No.: US 11,069,268 B2
(45) Date of Patent: Jul. 20, 2021

(54) FLEXIBLE DISPLAY PANEL AND FLEXIBLE DISPLAY APPARATUS

(71) Applicant: BOE Technology Group Co., Ltd., Beijing (CN)

(72) Inventors: Yanan Niu, Beijing (CN); Lei Chen, Beijing (CN); Zhongyuan Sun, Beijing (CN); Hongwei Tian, Beijing (CN); Wei Huang, Beijing (CN); Zhiqiang Jiao, Beijing (CN); Kuanjun Peng, Beijing (CN); Yichi Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/639,108

(22) PCT Filed: Mar. 8, 2019

(86) PCT No.: PCT/CN2019/077486
§ 371 (c)(1),
(2) Date: Feb. 13, 2020

(87) PCT Pub. No.: WO2020/181415
PCT Pub. Date: Sep. 17, 2020

(65) Prior Publication Data
US 2021/0134196 A1 May 6, 2021

(51) Int. Cl.
*G09G 3/00* (2006.01)
*H01L 51/00* (2006.01)
(Continued)

(52) U.S. Cl.
CPC ............. *G09G 3/006* (2013.01); *G09G 3/035* (2020.08); *H01L 27/3276* (2013.01);
(Continued)

(58) Field of Classification Search
CPC .... G09G 3/006; G09G 3/035; H01L 27/3276; H01L 27/3246; H01L 51/0097; H01L 51/5253; G06F 1/1652
See application file for complete search history.

(56) References Cited

U.S. PATENT DOCUMENTS 9,536,860 B2 * 1/2017 Yoon ...................... H01L 25/048
9,799,708 B2 * 10/2017 Hong .................... H01L 27/326
(Continued)

FOREIGN PATENT DOCUMENTS

| CN | 107221549 A | 9/2017 |
|----|-------------|--------|
| CN | 107887416 A | 4/2018 |

(Continued)

OTHER PUBLICATIONS

International Search Report & Written Opinion dated Dec. 4, 2019, regarding PCT/CN2019/077486.

*Primary Examiner* — Sardis F Azongha
(74) *Attorney, Agent, or Firm* — Intellectual Valley Law, P.C.

(57) ABSTRACT

A flexible display panel includes a plurality of light-emitting regions separated from each other, a respective one of the plurality of light-emitting regions including a light emitting element and an encapsulating structure encapsulating the light emitting element; and a plurality of dummy regions connecting the plurality of light-emitting regions, a respective one of the plurality of light-emitting regions having a larger thickness than a respective dummy region and including a plurality of driving wires. The flexible display panel further includes a detecting wire in the plurality of dummy regions and the plurality of light emitting regions.

18 Claims, 8 Drawing Sheets

(51) Int. Cl.
*H01L 51/52* (2006.01)
*H01L 27/32* (2006.01)

(52) U.S. Cl.
CPC ...... *H01L 51/0097* (2013.01); *H01L 51/5253* (2013.01); *G09G 2300/0413* (2013.01); *G09G 2330/12* (2013.01); *G09G 2380/02* (2013.01)

(56) References Cited

U.S. PATENT DOCUMENTS

| | | | | |
|---|---|---|---|---|
| 9,841,548 B2* | 12/2017 | Kim | .................. | G02B 6/0041 |
| 10,310,560 B2* | 6/2019 | Choi | .................... | G06F 1/1652 |
| 10,461,142 B2* | 10/2019 | Hong | ................. | H01L 51/5253 |
| 2006/0169989 A1* | 8/2006 | Bhattacharya | ........ | H01L 21/469 |
| | | | | 257/79 |
| 2011/0291098 A1* | 12/2011 | Hayafuji | ................ | G09G 3/006 |
| | | | | 257/59 |
| 2014/0097430 A1* | 4/2014 | Park | .................... | H01L 27/3276 |
| | | | | 257/48 |
| 2014/0299362 A1* | 10/2014 | Park | ..................... | H05K 1/0283 |
| | | | | 174/254 |
| 2016/0049602 A1* | 2/2016 | Kim | ................. | H01L 27/3244 |
| | | | | 257/40 |
| 2016/0284771 A1 | 9/2016 | Hwang | | |
| 2017/0278920 A1 | 9/2017 | Park et al. | | |
| 2018/0097044 A1 | 4/2018 | Choi | | |
| 2019/0273124 A1 | 9/2019 | Leng et al. | | |
| 2019/0341433 A1* | 11/2019 | Im | ...................... | H01L 27/3225 |

FOREIGN PATENT DOCUMENTS

| | | | | |
|---|---|---|---|---|
| CN | 108389869 A | | 8/2018 | |
| CN | 109036145 A | | 12/2018 | |
| CN | 109346504 A | | 2/2019 | |
| KR | 20200009921 A | * | 1/2020 | ......... H01L 27/3246 |

\* cited by examiner

FLEXIBLE DISPLAY PANEL AND FLEXIBLE DISPLAY APPARATUS

CROSS-REFERENCE TO RELATED APPLICATION

This application is a national stage application under 35 U.S.C. § 371 of International Application No. PCT/CN2019/077486, filed Mar. 8, 2019, the contents of which are incorporated by reference in the entirety.

TECHNICAL FIELD

The present invention relates to display technology, more particularly, to a flexible display panel and a flexible display apparatus.

BACKGROUND

Flexible electronic apparatuses and stretchable electronic apparatuses have been developed in recent years. Flexible electronic apparatuses are apparatuses that may be bent or folded, typically fabricated by mounting an electronic device on a flexible base substrate. Stretchable electronic apparatuses are apparatuses that allows its length to be increased in one or more dimensions. Stretchable electronic apparatuses may be useful in various applications including in display apparatuses and sensor arrays.

SUMMARY

In one aspect, the present invention provides a flexible display panel, comprising a plurality of light-emitting regions separated from each other, a respective one of the plurality of light-emitting regions comprising a light emitting element and an encapsulating structure encapsulating the light emitting element; and a plurality of dummy regions connecting the plurality of light-emitting regions, a respective one of the plurality of light-emitting regions having a larger thickness than a respective dummy region and comprising a plurality of driving wires; wherein the flexible display panel further comprises a detecting wire in the plurality of dummy regions and the plurality of light emitting regions.

Optionally, the detecting wire is in a peripheral region of a respective one of the plurality of light emitting regions.

Optionally, the flexible display panel further comprises a base substrate and a pixel definition layer on the base substrate and defining a subpixel aperture for the light emitting element; wherein an orthographic projection of the detecting wire in the peripheral region of the respective one of the plurality of light emitting regions on the base substrate at least partially overlaps with an orthographic projection of the pixel definition layer on the base substrate.

Optionally, the encapsulating structure comprises at least two inorganic encapsulating sublayers; and the detecting wire is in direct contact with one of the at least two inorganic encapsulating sublayers.

Optionally, the detecting wire is between two inorganic encapsulating sublayers of the encapsulating structure, the detecting wire being in direct contact with each of the two inorganic encapsulating sublayers.

Optionally, the detecting wire is a flexible conductive wire.

Optionally, the detecting wire continuously extends through a plurality of inter-light emitting element regions, each of which is between two adjacent light emitting elements of a plurality of light emitting elements.

Optionally, the flexible display panel further comprises two test electrodes respectively connected to the detecting wire for testing connectivity of the detecting wire.

Optionally, the two test electrodes are respectively on two opposite sides of the flexible display panel.

Optionally, the flexible display panel is a stretchable display panel; wherein the plurality of light-emitting regions are a plurality of encapsulated islands, and the plurality of dummy regions are a plurality of bridges connecting the plurality of encapsulated islands; the encapsulating structure extending throughout the plurality of bridges and the plurality of encapsulated islands; a respective one of the plurality of encapsulated islands comprising at least one of a plurality of light emitting elements encapsulated therein on a base substrate; and the detecting wire is in at least one of the plurality of bridges for enhancing mechanical strength of the at least one of the plurality of bridges.

Optionally, the flexible display panel further comprises a plurality of driving circuits for driving light emission of the plurality of light emitting elements; wherein the plurality of driving circuits comprise the plurality of driving wires passing through the at least one of the plurality of bridges; the encapsulating structure comprises a first inorganic encapsulating sublayer extending throughout the plurality of encapsulated islands and the plurality of bridges; the first inorganic encapsulating sublayer encapsulates the plurality of driving wires in the at least one of the plurality of bridges on the base substrate; the detecting wire is on a side of the first inorganic encapsulating sublayer away from the base substrate and in direct contact with the first inorganic encapsulating sublayer; and the plurality of driving wires are on a side of the first inorganic encapsulating sublayer away from the detecting wire.

Optionally, the first inorganic encapsulating sublayer has a reduced thickness in the plurality of bridges as compared to in the plurality of encapsulated islands.

Optionally, the flexible display panel further comprises a second inorganic encapsulating sublayer extending throughout the plurality of encapsulated islands and the plurality of bridges; wherein the second inorganic encapsulating sublayer in the at least one of the plurality of bridges is on a side of the detecting wire away from the first inorganic encapsulating sublayer, encapsulating the detecting wire in the at least one of the plurality of bridges; and the detecting wire is in direct contact with the first inorganic encapsulating sublayer and the second inorganic encapsulating sublayer.

Optionally, the second inorganic encapsulating sublayer has a reduced thickness in the plurality of bridges as compared to in the plurality of encapsulated islands.

Optionally, the detecting wire includes a plurality of wires, and a respective one of the plurality of wires continuously extends through multiple bridges of the plurality of bridges connecting multiple encapsulated islands of the plurality of encapsulated islands.

Optionally, the flexible display panel further comprises two test electrodes respectively connected to the respective one of the plurality of wires for testing connectivity of the respective one of the plurality of wires.

Optionally, the respective one of the plurality of wires extends through the multiple bridges of the plurality of bridges connecting the multiple encapsulated islands of the plurality of encapsulated islands including two encapsulated islands of the plurality of encapsulated islands respectively on two opposite sides of the flexible display panel.

Optionally, the respective one of the plurality of wires passes through peripheral regions of the multiple encapsulated islands of the plurality of encapsulated islands.

Optionally, the encapsulating structure in the plurality of encapsulated islands comprises a first inorganic encapsulating sublayer; and a portion of the respective one of the plurality of wires in the peripheral regions of the multiple encapsulated islands of the plurality of encapsulated islands is in direct contact with the first inorganic encapsulating sublayer, and on a side of the first inorganic encapsulating sublayer away from the plurality of light emitting elements.

Optionally, the flexible display panel further comprises a plurality of driving circuits for driving light emission of the plurality of light emitting elements; wherein the plurality of driving circuits comprise the plurality of driving wires passing through the at least one of the plurality of bridges; and a portion of a respective one of the plurality of driving wires in the peripheral regions of the multiple encapsulated islands of the plurality of encapsulated islands is on a side of the first inorganic encapsulating sublayer away from the portion of the respective one of the plurality of wires in the peripheral regions of the multiple encapsulated islands of the plurality of encapsulated islands.

Optionally, the encapsulating structure in the plurality of encapsulated islands further comprises an organic encapsulating sublayer on a side of the first inorganic encapsulating sublayer away from the plurality of light emitting elements; the organic encapsulating sublayer is on a side of the portion of the respective one of the plurality of wires in the peripheral regions of the multiple encapsulated islands of the plurality of encapsulated islands away from the first inorganic encapsulating sublayer; and the portion of the respective one of the plurality of wires in the peripheral regions of the multiple encapsulated islands of the plurality of encapsulated islands is in direct contact with the organic encapsulating sublayer.

Optionally, the flexible display panel further comprises a plurality of gaps between the plurality of dummy regions.

In another aspect, the present invention provides a flexible display apparatus, comprising the flexible display panel described herein, and one or more integrated circuits connected to the flexible display panel.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

It is discovered in the present disclosure that, in a flexible display panel, an encapsulating structure is prone to damages such as cracks when the flexible display panel is subject to frequent bending and stretching. For example, it is discovered in the present disclosure that, in a stretchable display panel, bridges connecting encapsulated islands are prone to damages because the bridges are subject to frequent bending and stretching. Even if the bridges are encapsulated by an encapsulating layer, the encapsulating layer is prone to break during use, thus exposing the connecting lines in the bridges.

Accordingly, the present disclosure provides, inter ala, a flexible display panel and a flexible display apparatus that substantially obviate one or more of the problems due to limitations and disadvantages of the related art. In one aspect, the present disclosure provides a flexible display panel. In some embodiments, the flexible display panel includes a plurality of light-emitting regions separated from each other, a respective one of the plurality of light-emitting regions including a light emitting element and an encapsulating structure encapsulating the light emitting element; and a plurality of dummy regions connecting the plurality of light-emitting regions, a respective one of the plurality of light-emitting regions having a larger thickness than a respective dummy region and including a plurality of driving wires. Optionally, the flexible display panel further includes a detecting wire in the plurality of dummy regions and the plurality of light emitting regions. Optionally, the detecting wire is in a peripheral region of a respective one of the plurality of light emitting regions. Optionally, the flexible display panel further includes a base substrate and a pixel definition layer on the base substrate and defining a subpixel aperture for the light emitting element. Optionally, an orthographic projection of the detecting wire in the peripheral region of the respective one of the plurality of light emitting regions on the base substrate at least partially overlaps with an orthographic projection of the pixel definition layer on the base substrate.

In some embodiments, the flexible display panel includes a plurality of light emitting elements and an encapsulating structure encapsulating the plurality of light emitting elements. Optionally, the encapsulating structure includes a detecting wire having a plurality of wires for preventing cracks in the encapsulating structure. Optionally, the detecting wire is in contact with at least one sublayer of the encapsulating structure. Optionally, the detecting wire spans across at least two inter-light emitting element regions, each of which is between two adjacent light emitting elements of the plurality of light emitting elements.

Various appropriate light emitting elements may be used in the present flexible display panel. Examples of appropriate light emitting elements include organic light emitting diodes, quantum dots light emitting diodes, and micro light emitting diodes.

Figure 1:
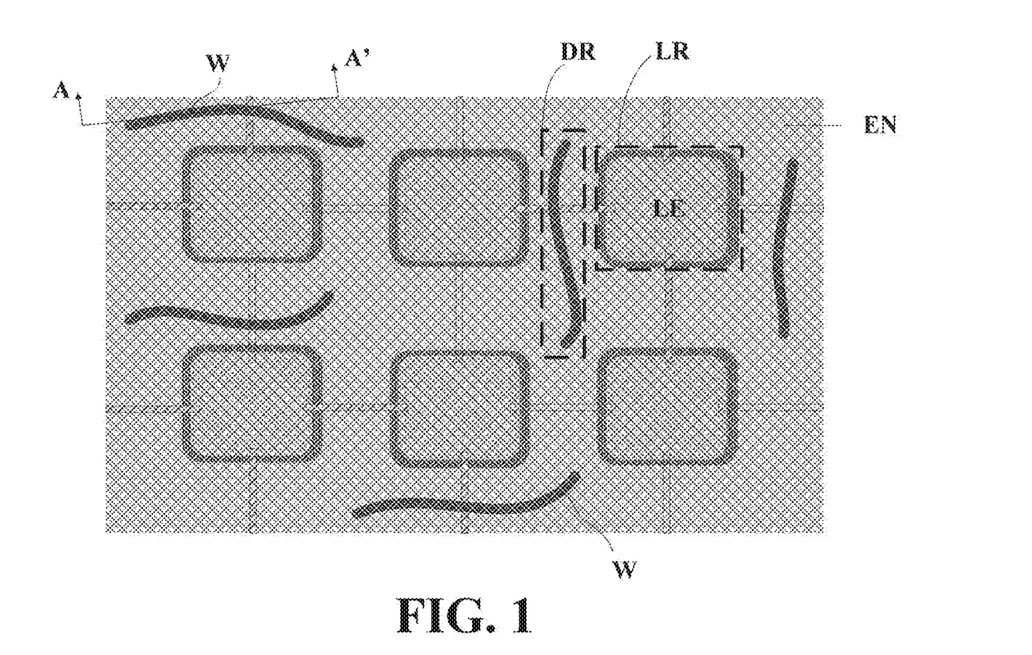
FIG. 1 is a schematic diagram illustrating the structure of a flexible display panel in some embodiments of the present disclosure.
Figure 2:
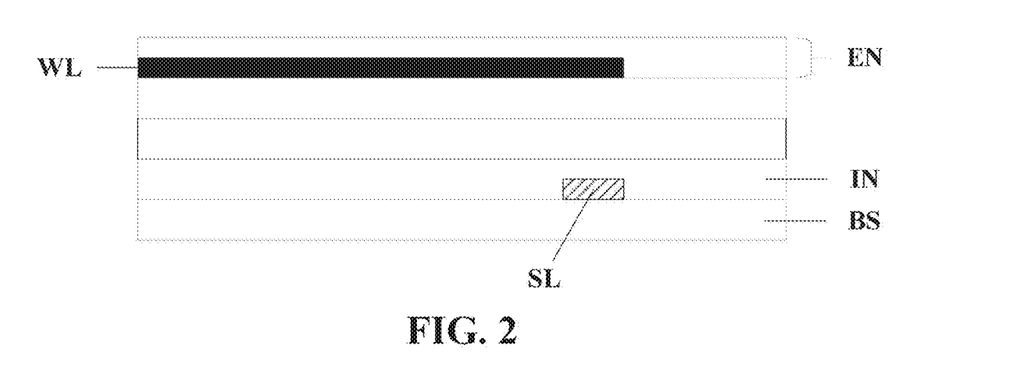
FIG. 2 is a cross-sectional view along an A-A' line in FIG. 1.

FIG. 1 is a schematic diagram illustrating the structure of a flexible display panel in some embodiments of the present disclosure. FIG. 2 is a cross-sectional view along an A-A' line in FIG. 1. Referring to FIG. 1, the flexible display panel in some embodiments includes a plurality of light-emitting regions LR separated from each other, and a plurality of dummy regions DR connecting the plurality of light-emitting regions LR. A respective one of the plurality of light-emitting regions LR includes a respective one or more of a plurality of light emitting elements LE and an encapsulating structure EN encapsulating the respective one or more of a plurality of light emitting elements LE. Referring to FIG. 1 and FIG. 2, the flexible display panel in some embodiments includes a plurality of light emitting elements LE and an encapsulating structure EN encapsulating the plurality of light emitting elements LE. Optionally, the encapsulating structure EN is light transmissive. In some embodiments, the flexible display panel further includes a detecting wire WL in the plurality of dummy regions DR and the plurality of light emitting regions LR. Optionally, the encapsulating structure EN includes the detecting wire WL, the detecting wire WL may include a plurality of wires W for preventing cracks in the encapsulating structure EN. Optionally, the detecting wire WL is in direct contact with at least one sublayer of the encapsulating structure EN. Optionally, the detecting wire WL spans across at least two inter-light emitting element regions, each of which is between two adjacent light emitting elements of the plurality of light emitting elements LE. Optionally, a respective one of the plurality of light-emitting regions LR has a larger thickness than a respective dummy region DR and including a plurality of driving wires different from the detecting wire WL. Optionally, the detecting wire WL is in a peripheral region of a respective one of the plurality of light emitting regions LR.

Figure 3:
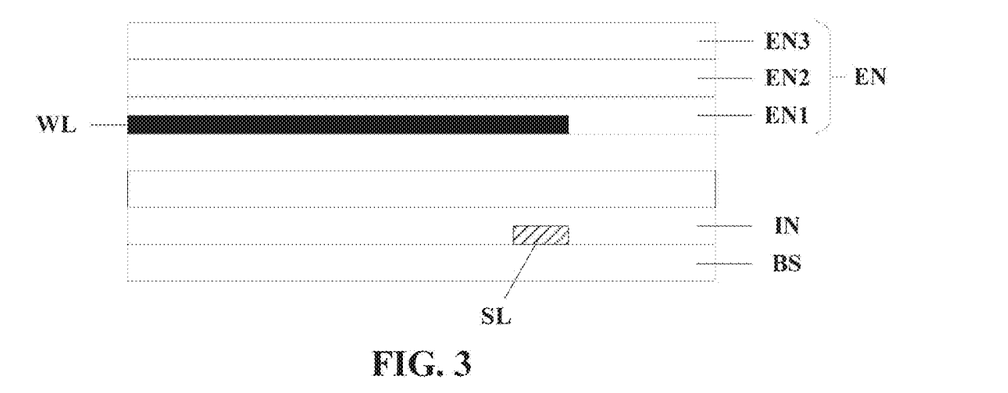
FIG. 3 is a cross-sectional view of a part of a flexible display panel in some embodiments of the present disclosure.

FIG. 3 is a cross-sectional view of a part of a flexible display panel in some embodiments of the present disclosure. Referring to FIG. 3, the encapsulating structure EN includes a plurality of encapsulating sublayers, including a first inorganic encapsulating sublayer EN1, an organic encapsulating sublayer EN2 on the first inorganic encapsulating sublayer EN1, and a second inorganic encapsulating sublayer EN3 on a side of the organic encapsulating sublayer EN2 away from the first inorganic encapsulating sublayer EN1. Optionally, the detecting wire WL of the encapsulating structure EN is in contact with the first inorganic encapsulating sublayer EN.

Figure 4:
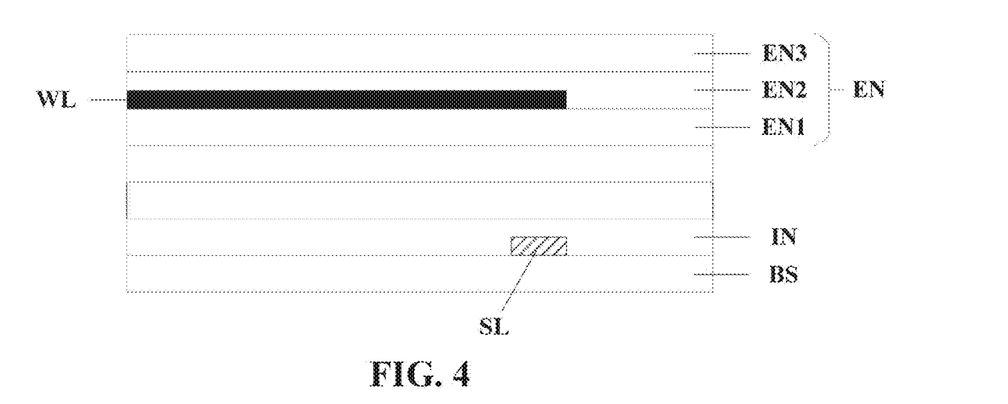
FIG. 4 is a cross-sectional view of a part of a flexible display panel in some embodiments of the present disclosure.

FIG. 4 is a cross-sectional view of a part of a flexible display panel in some embodiments of the present disclosure. Referring to FIG. 4, the detecting wire WL of the encapsulating structure EN is in contact with the first inorganic encapsulating sublayer EN1 and the organic encapsulating sublayer EN2. The detecting wire WL is sandwiched between the first inorganic encapsulating sublayer EN1 and the organic encapsulating sublayer EN2.

Figure 5:
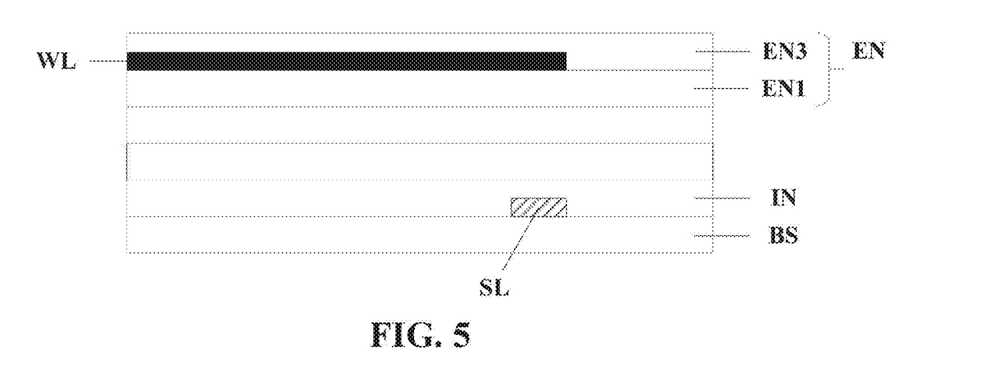
FIG. 5 is a cross-sectional view of a part of a flexible display panel in some embodiments of the present disclosure.

FIG. 5 is a cross-sectional view of a part of a flexible display panel in some embodiments of the present disclosure. Referring to FIG. 5, the detecting wire WL of the encapsulating structure EN is between a first inorganic encapsulating sublayer EN1 and a second inorganic encapsulating sublayer EN3. The detecting wire WL is in direct contact with the first inorganic encapsulating sublayer EN1 and with the second inorganic encapsulating sublayer EN3.

Referring to FIGS. 2 to 5, the flexible display panel in some embodiments further includes a flexible base substrate BS, a plurality of driving wires SL on the flexible base substrate BS, and an insulating layer IN on a side of the plurality of driving wires SL away from the flexible base substrate BS.

It is discovered in the present disclosure that, by embedding a detecting wire including a plurality of wires in the encapsulating structure, the mechanical strength of the encapsulating structure can be much enhanced. For example, when a flexible display panel is bent or folded, the inorganic sublayer of the encapsulating structure is prone to crack or other damages, which in turn leads to reduced resistance to oxygen and moist. By having a detecting wire embedded in the encapsulating structure, the flexible display panel is significantly less prone to crack or other damages when bent or folded, enhancing the life time of the display panel.

Various appropriate materials may be used for making the plurality of wires of the detecting wire. In some embodiments, the plurality of wires of the detecting wire are made of a flexible material such as various polymers, various metals and alloys, and various appropriate inorganic materials. Optionally, the plurality of wires are made of an insulating material. Optionally, the plurality of wires are made of a conductive material. Examples of insulating wires include plastic wires (e.g., nylon wires), ceramic wires, fiberglass wires, fiberglass reinforced plastic wires, carbon fiber reinforced plastic wires. Examples of conductive wires include metal wires (e.g., metal nanowires), metal mesh, graphene wires (e.g., graphene nanowires), graphene mesh, carbon nanotube wires, carbon nanotube mesh. In some embodiments, the plurality of wires are made of a material having a Young's modulus less than 500 Gpa, e.g., less than 400 Gpa, less than 300 Gpa, less than 200 Gpa, less than 100 Gpa, less than 50 Gpa, less than 25 Gpa, less than 10 Gpa, and less than 1 Gpa.

In some embodiments, a material having good bonding characteristics with at least one of the encapsulating sublayers in direct contact with the plurality of wires is selected for making the plurality of wires. In some embodiments, an adhesive layer is applied on the encapsulating sublayer in direct contact with the plurality of wires either prior to or subsequent to forming the plurality of wires for bonding the plurality of wires adhesively to the encapsulating structure. In some embodiments, subsequent to forming the plurality of wires, an annealing treatment is applied to the plurality of wires and the encapsulating sublayer in direct contact with the plurality of wires, to enhance the bonding between the plurality of wires and the encapsulating sublayer in direct contact with the plurality of wires.

As used herein, the term "wire" or "wires" refers to any elongated insulating or conductive or semi-conductive material (or other material described herein) that includes at least one cross sectional dimension that is less than 5 mm, e.g., less than 1 mm, and has an aspect ratio (length:width) of greater than 10, e.g., greater than 50, greater than 100. Optionally, the plurality of wires are a plurality of microwires. Optionally, the plurality of wires are a plurality of nanowires. As used herein, the term "microwire" generally refers to any elongated insulating or conductive or semi-conductive material (or other material described herein) that includes at least one cross sectional dimension that is less than 500 μm, and preferably, less than 100 μm, and has an aspect ratio (length:width) of greater than 10, preferably greater than 50, and more preferably, greater than 100. As used herein, the term "nanowire" generally refers to any elongated insulating or conductive or semi-conductive material (or other material described herein) that includes at least one cross sectional dimension that is less than 500 nm, and preferably, less than 100 nm, and has an aspect ratio (length: width) of greater than 10, preferably greater than 50, and more preferably, greater than 100.

Figure 6:
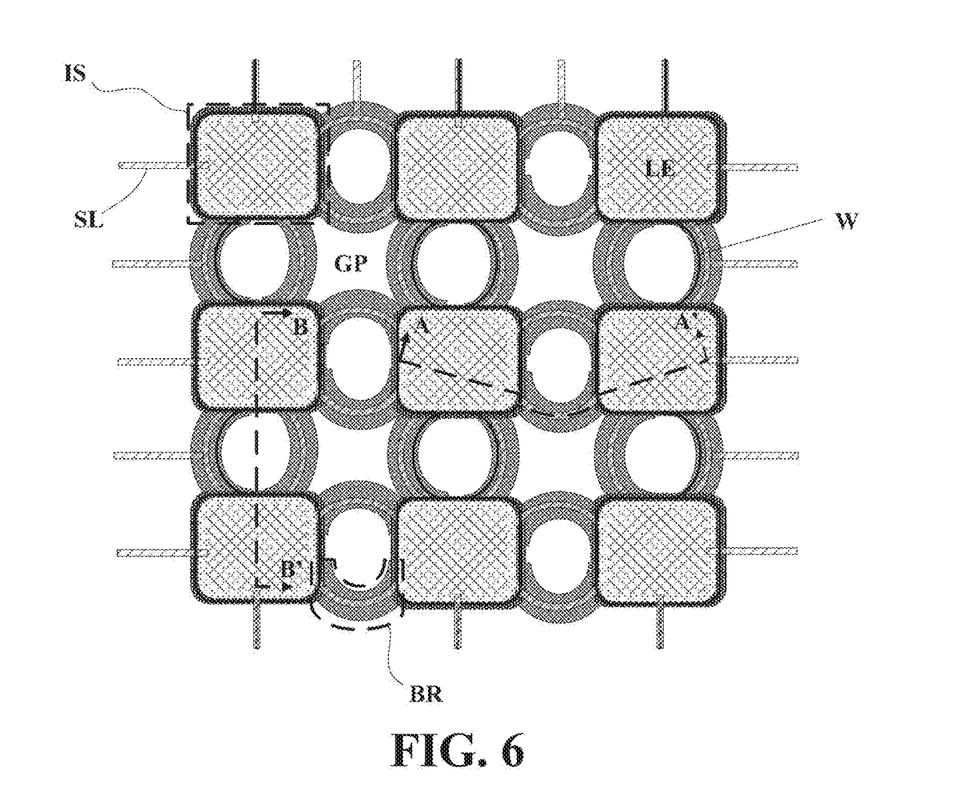
FIG. 6 is a schematic diagram illustrating the structure of a flexible display panel in some embodiments of the present disclosure.
Figure 7:
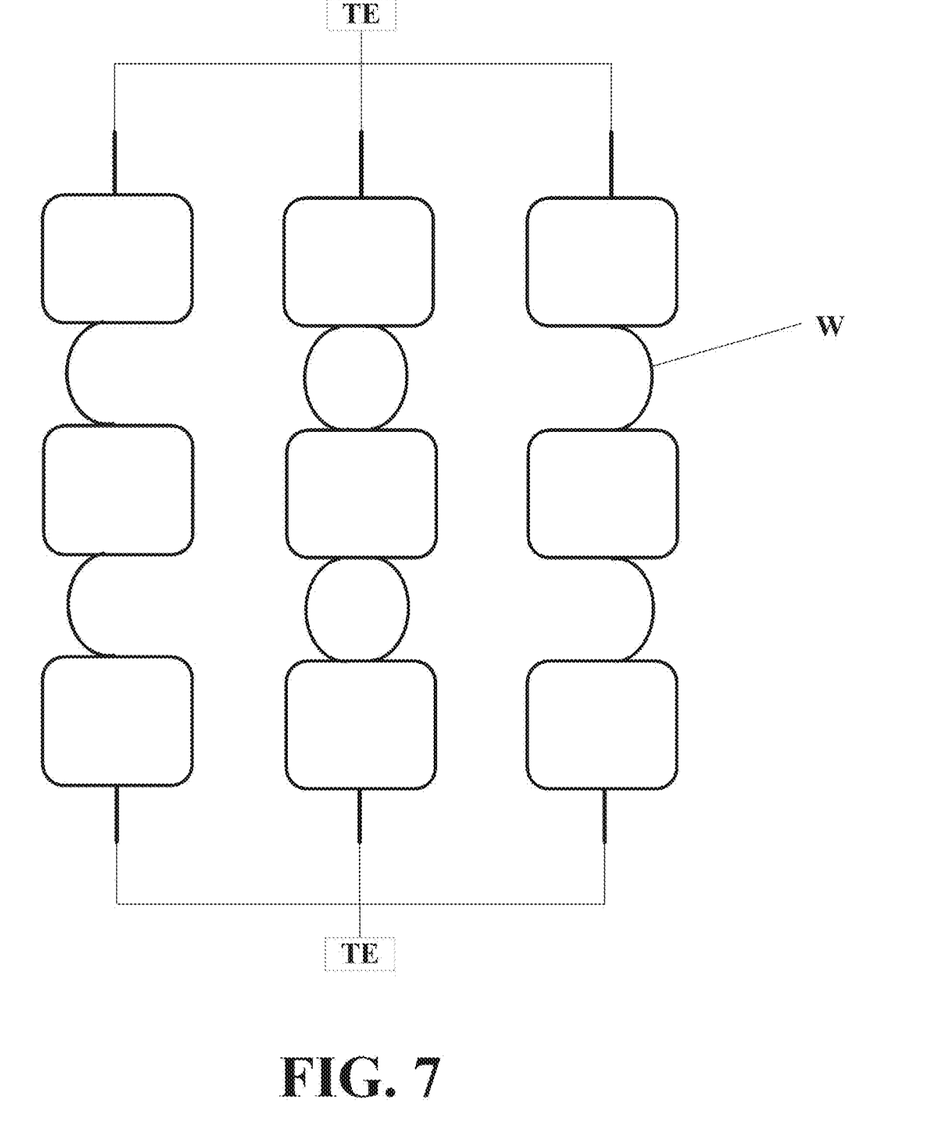
FIG. 7 is a schematic diagram illustrating the structure of a detecting wire in some embodiments of the present disclosure.

In some embodiments, the flexible display panel is a stretchable display panel. Optionally, the stretchable display panel includes a plurality of encapsulated islands and a plurality of bridges connecting the plurality of encapsulated islands. Optionally, the encapsulating structure extends throughout the plurality of bridges and the plurality of encapsulated islands. FIG. 6 is a schematic diagram illustrating the structure of a flexible display panel in some embodiments of the present disclosure. FIG. 7 is a schematic diagram illustrating the structure of a detecting wire in some embodiments of the present disclosure. Referring to FIG. 6 and FIG. 7, in some embodiments, a respective one of the plurality of wires W continuously extends through a plurality of inter-light emitting element regions, each of which is between two adjacent light emitting elements of the plurality of light emitting elements LE. For example, in some embodiments, the respective one of the plurality of wires W continuously extends through multiple bridges of the plurality of bridges BR connecting multiple encapsulated islands of the plurality of encapsulated islands IS. For example, the plurality of wires W may form a plurality of rows or a plurality of columns, each of which spans across the flexible display panel along a row direction or a column direction.

As used herein, the term "stretchable" refers to the ability of a material, structure, device or device component to be strained in tension (e.g., being made longer and/or wider) without undergoing permanent deformation or failure such as fracture, e.g., the ability to elongate at least 10% of its length without permanently deforming, tearing, or breaking. The term is also meant to encompass substrates having components (whether or not the components themselves are individually stretchable as stated above) that are configured in such a way so as to accommodate a stretchable, inflatable, or expandable surface and remain functional when applied to a stretchable, inflatable, or otherwise expandable surface that is stretched, inflated, or otherwise expanded respectively. The term is also meant to encompass substrates that may be elastically and/or plastically deformable (i.e. after being stretched, the substrate may return to its original size when the stretching force is released or the substrate may not return to its original size and in some examples, may remain in the stretched form) and the deformation (i.e. stretching and optionally flexing) may occur during manufacture of the substrate (e.g. with the substrate being stretched and optionally flexed to form its final shape), during assembly of a device incorporating the substrate (which may be considered part of the manufacturing operation) and/or during use (e.g. with the user being able to stretch and optionally flex the substrate).

In some embodiments, the plurality of wires W may be used as testing signal lines for detecting damages such as cracks or line opens in the encapsulating structure of the flexible display panel. When the encapsulating structure of the flexible display panel is damaged, one or more of the plurality of wires W at the damaged position are affected, for example, broken. The damaged one or more of the plurality of wires W at the damaged position leads to an increased resistances in the one or more of the plurality of wires W. In one example, by detecting the resistance of the one or more of the plurality of wires W, cracks or other damages occurred in the flexible display panel can be detected.

Referring to FIG. 7, in some embodiments, the flexible display panel further includes two test electrodes TE respectively connected to the respective one of the plurality of wires W for testing connectivity of the respective one of the plurality of wires W. Optionally, a respective one of the plurality of wires W is separately connected to two test electrode TE. Optionally, as shown in FIG. 7, one of the two test electrodes TE is commonly connected to first terminals of multiple ones of the plurality of wires W, and another of the two test electrodes TE is commonly connected to second terminals of the multiple ones of the plurality of wires W, and the multiple ones of the plurality of wires W are electrically connected in parallel. The two test electrodes TE may be disposed. e.g., on two opposite sides of the flexible display panel.

Referring to FIG. 6, in some embodiments, the flexible display panel is a stretchable display panel having a plurality of encapsulated islands IS and a plurality of bridges BR connecting the plurality of encapsulated islands IS, the encapsulating structure extending throughout the plurality of bridges BR and the plurality of encapsulated islands IS. A respective one of the plurality of encapsulated islands IS includes at least one (e.g., 1, 2, 3, 4, 5, 6, and so on) of the plurality of light emitting elements LE encapsulated therein on a base substrate. Optionally, the detecting wire is in at least one of the plurality of bridges BR for enhancing mechanical strength of the at least one of the plurality of bridges BR. Optionally, a respective one of the plurality of bridges BR includes at least a portion of a respective one of the plurality of wires W.

Referring to FIG. 6, in some embodiments, the flexible display panel has a plurality of gaps GP in which the flexible display panel is carved through the base substrate. Optionally, a respective one of at least multiple ones of the plurality of gaps GP is surrounded by multiple ones of the plurality of bridges BR. Optionally, a respective one of at least multiple ones of the plurality of gaps GP is between two adjacent encapsulated islands of the plurality of encapsulated islands IS. Optionally, a respective one of at least multiple ones of the plurality of gaps GP is surrounded by two adjacent encapsulated islands of the plurality of encapsulated islands IS and two adjacent bridges of the plurality of bridges BR connecting the two adjacent encapsulated islands.

Figure 8:
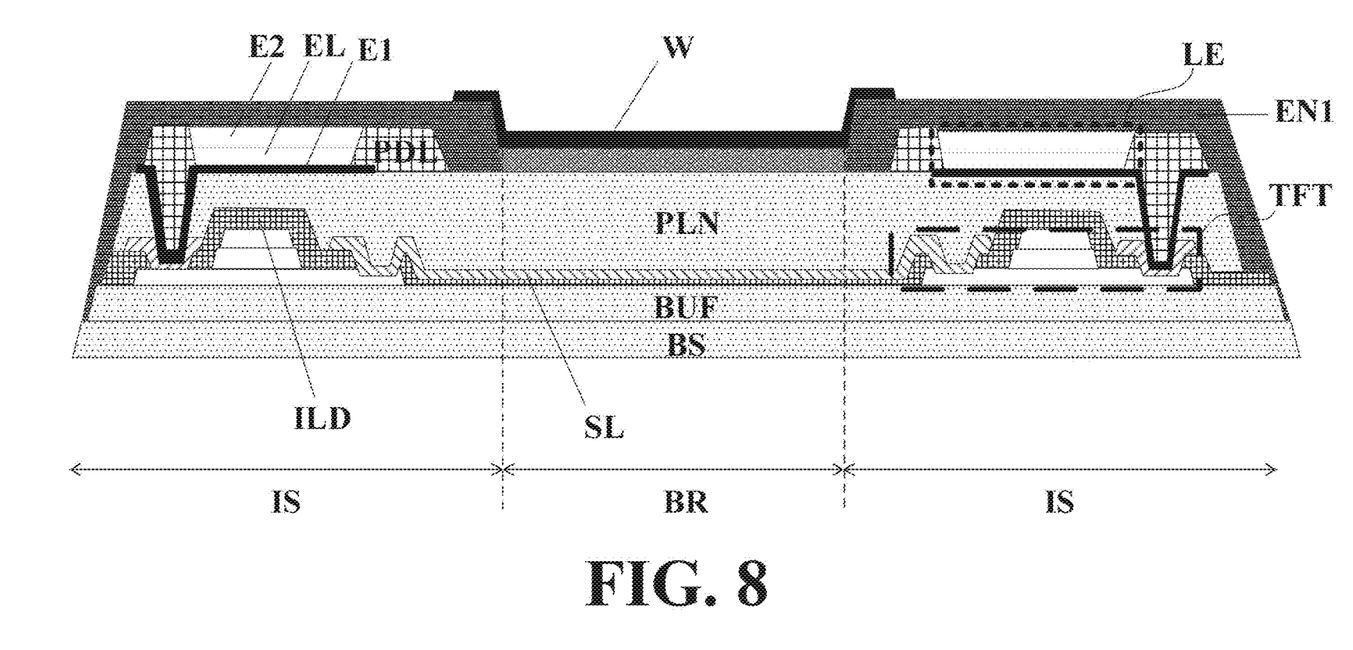
FIG. 8 is a cross-sectional view along an A-A' line in FIG. 6.
Figure 9:
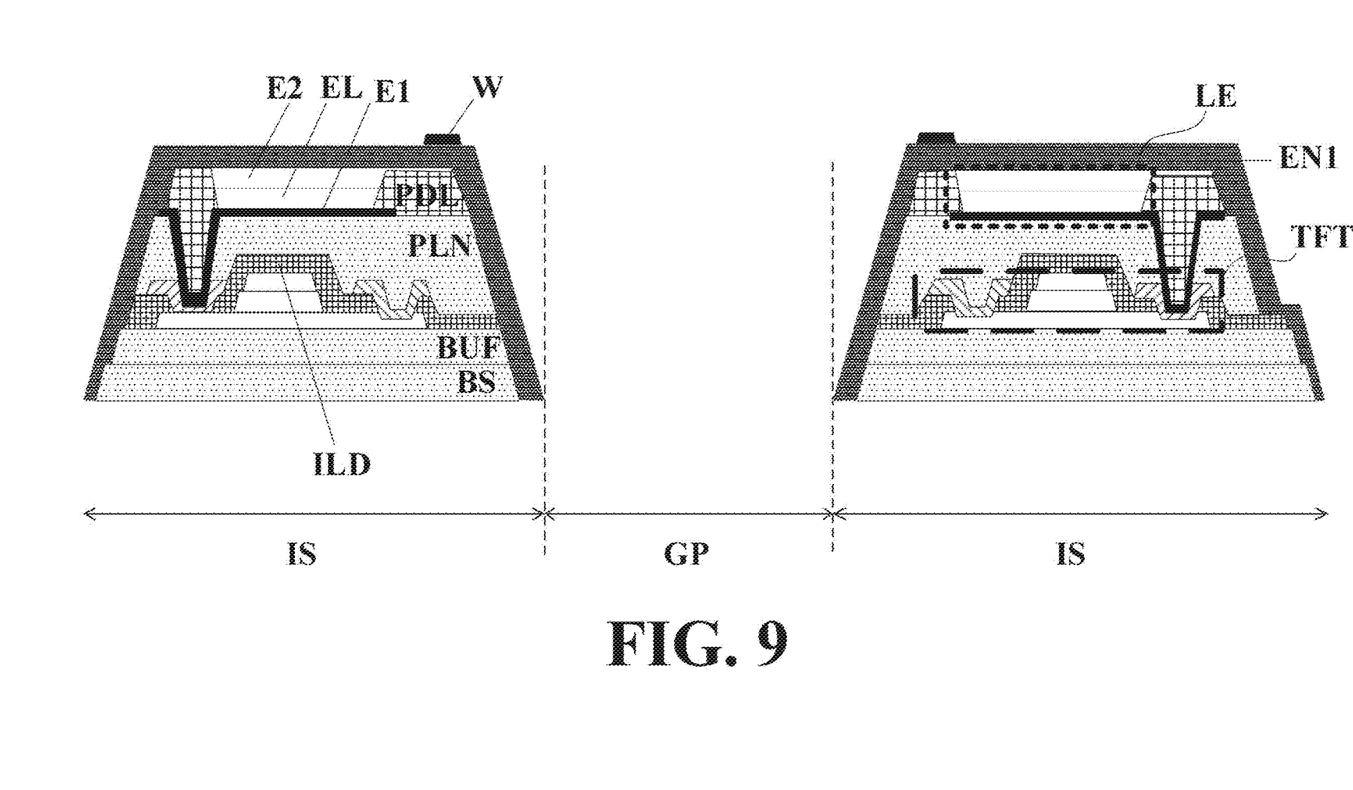
FIG. 9 is a cross-sectional view along a B-B' line in FIG. 6.

FIG. 8 is a cross-sectional view along an A-A' line in FIG. 6. FIG. 9 is a cross-sectional view along a B-B' line in FIG. 6. Referring to FIG. 8 and FIG. 9, the flexible display panel in some embodiments further includes a flexible base substrate BS, a plurality of driving circuits for driving light emission of the plurality of light emitting elements LE on the flexible base substrate BS. The plurality of driving circuits include a plurality of thin film transistors TFT, and a plurality of driving wires SL passing through at least one of the plurality of bridges BR. Optionally, the flexible display panel further includes an inter-layer dielectric layer ILD on a side of the plurality of thin film transistors TFT away from the flexible base substrate BS, and a buffer layer BUF between the flexible base substrate BS and the plurality of thin film transistors TFT. Optionally, the flexible display panel further includes a planarization layer PLN on a side of the inter-layer dielectric layer ILD away from the flexible base substrate BS. A respective one of the light emitting elements LE includes a first electrode E1, a light emitting layer EL on the first electrode E1, and a second electrode E2 on a side of the light emitting layer EL away from the first electrode E1. A respective one of the plurality of thin film transistors is connected to the first electrode E1 of a respective one of the plurality of light emitting elements LE. The flexible display panel further includes a pixel definition layer PDL defining a plurality of subpixel apertures respectively corresponding to the plurality of light emitting elements LE.

Examples of the plurality of driving wires SL include gate lines, data lines, common electrode signal lines, and so on.

In some embodiments, the encapsulating structure includes a first inorganic encapsulating sublayer EN1 extending throughout the plurality of encapsulated islands IS and the plurality of bridges BR. The first inorganic encapsulating sublayer EN1 is on a side of the plurality of light emitting elements LE away from the flexible base substrate BS, and encapsulates the plurality of light emitting elements LE and the plurality of driving wires SL. In the at least one of the plurality of bridges BR, the first inorganic encapsulating sublayer EN1 encapsulates a respective one or more of the plurality of driving wires SL. The plurality of wires W are on a side of the first inorganic encapsulating sublayer EN1 away from the flexible base substrate BS and in direct contact with the first inorganic encapsulating sublayer EN1. Optionally, the respective one or more of the plurality of driving wires SL is spaced apart from the first inorganic encapsulating sublayer EN1 by at least one insulating layer, e.g., by the planarization layer PLN. The plurality of driving wires SL are on a side of the first inorganic encapsulating sublayer EN1 away from the plurality of wires W.

Optionally, the first inorganic encapsulating sublayer EN1 has a reduced thickness in the plurality of bridges BR as compared to in the plurality of encapsulated islands IS. By having a reduced thickness, the plurality of bridges BR can have an enhanced flexibility, but still sufficiently encapsulated to protect the plurality of driving wires from external moist and oxygen. Optionally, the reduced thickness of the first inorganic encapsulating sublayer EN1 in the plurality of bridges BR is less than 80% (e.g., less than 70%, less than 60%, less than 50%, less than 40%, less than 30%) of a thickness of the first inorganic encapsulating sublayer EN1 in the plurality of encapsulated islands IS.

Referring to FIGS. 6 to 8, in some embodiments, a respective one of the plurality of wires W continuously extends through multiple bridges of the plurality of bridges BR connecting multiple encapsulated islands of the plurality of encapsulated islands IS. Optionally, two test electrodes TE are respectively connected to the respective one of the plurality of wires W for testing connectivity of the respective one of the plurality of wires W, as shown in FIG. 7. Optionally, the respective one of the plurality of wires W extends through the multiple bridges of the plurality of bridges BR connecting the multiple encapsulated islands of the plurality of encapsulated islands IS including two encapsulated islands of the plurality of encapsulated islands respectively on two opposite sides of the flexible display panel.

In some embodiments, referring to FIGS. 6 to 8, the respective one of the plurality of wires W passes through peripheral regions of the multiple encapsulated islands of the plurality of encapsulated islands IS. The portion of the respective one of the plurality of wires W in the peripheral regions of the multiple encapsulated islands of the plurality of encapsulated islands IS is in direct contact with the first inorganic encapsulating sublayer EN1, and on a side of the first inorganic encapsulating sublayer EN1 away from the plurality of light emitting elements LE, as shown in FIG. 8 and FIG. 9. A portion of a respective one of the plurality of driving wires SL in the peripheral regions of the multiple encapsulated islands of the plurality of encapsulated islands IS is on a side of the first inorganic encapsulating sublayer EN1 away from the portion of the respective one of the plurality of wires W in the peripheral regions of the multiple encapsulated islands of the plurality of encapsulated islands IS. For example, the portion of the respective one of the plurality of wires W and the portion of a respective one of the plurality of driving wires SL in the peripheral regions of the multiple encapsulated islands of the plurality of encapsulated islands IS are spaced apart from each other by at least the first inorganic encapsulating sublayer EN1. Optionally, the portion of the respective one of the plurality of wires W and the portion of a respective one of the plurality of driving wires SL in the peripheral regions of the multiple encapsulated islands of the plurality of encapsulated islands IS are further spaced apart from each other by one or a combination of a planarization layer PLN, an inter-layer dielectric layer ILD, and a pixel definition layer PDL, as shown in FIG. 8.

In some embodiments, referring to FIG. 8, the respective one of the plurality of driving wires SL in the at least one of the plurality of bridges BR is on a side of the first inorganic encapsulating sublayer EN1 away from the respective one of the plurality of wires W in the at least one of the plurality of bridges BR. For example, the respective one of the plurality of wires W and the respective one of the plurality of driving wires SL in the at least one of the plurality of bridges BR are spaced apart from each other by at least the first inorganic encapsulating sublayer EN1. Optionally, the respective one of the plurality of wires W and the respective one of the plurality of driving wires SL in the at least one of the plurality of bridges BR are further spaced apart from each other by a planarization layer PLN, as shown in FIG. 8.

Figure 10:
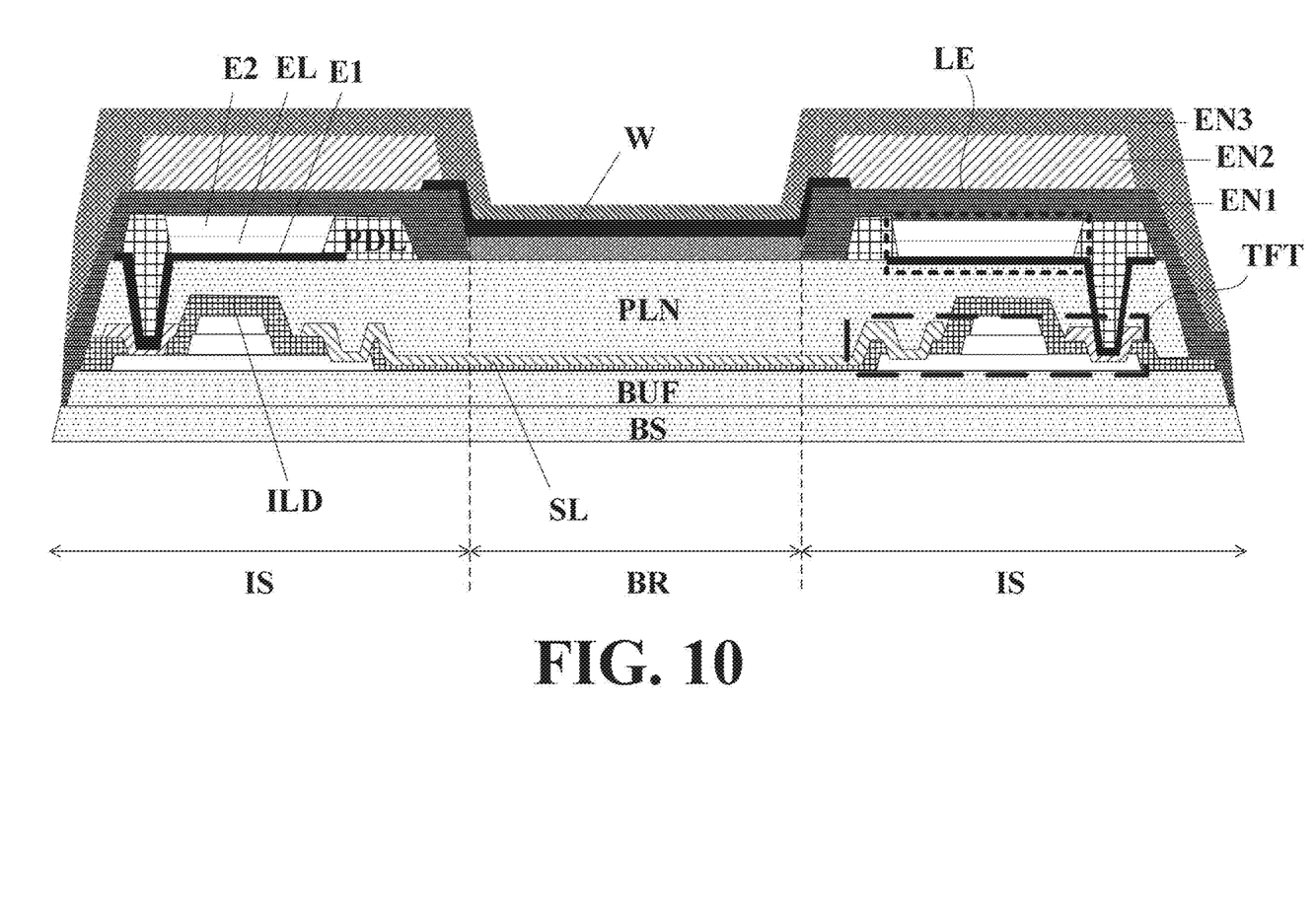
FIG. 10 is a cross-sectional view of a flexible display panel in some embodiments of the present disclosure.
Figure 11:
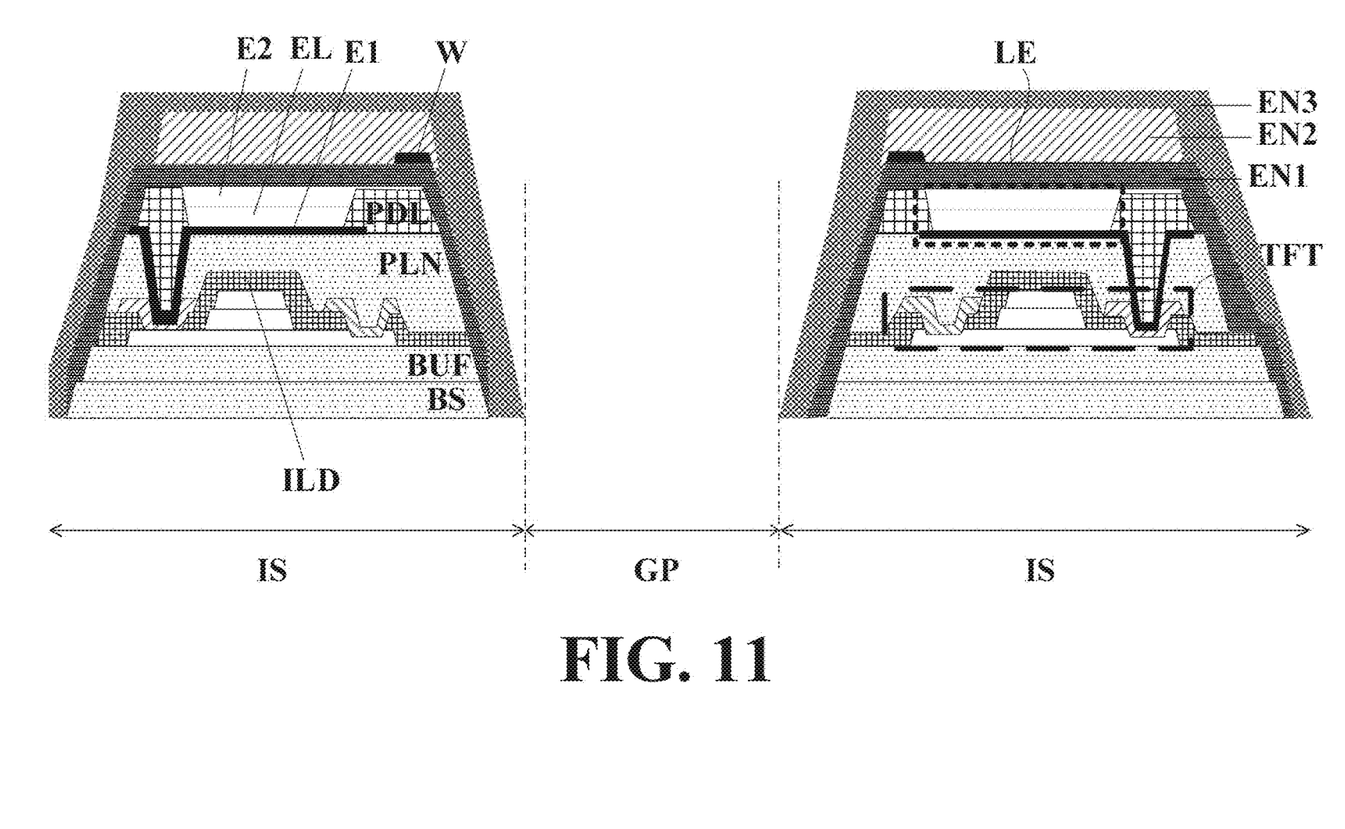
FIG. 11 is a cross-sectional view of a flexible display panel in some embodiments of the present disclosure.

FIG. 10 is a cross-sectional view of a flexible display panel in some embodiments of the present disclosure. FIG. 11 is a cross-sectional view of a flexible display panel in some embodiments of the present disclosure. Referring to FIG. 10 and FIG. 11, in some embodiments, the flexible display panel further includes a second inorganic encapsulating sublayer EN3 extending throughout the plurality of encapsulated islands IS and the plurality of bridges BR. The first inorganic encapsulating sublayer EN1 and the second inorganic encapsulating sublayer EN3 encapsulates the plurality of driving wires in the at least one of the plurality of bridges BR on the flexible base substrate BS. In some embodiments, the plurality of wires W are in at least one of the plurality of bridges BR for enhancing mechanical strength of the at least one of the plurality of bridges BR. As shown in FIG. 10, the second inorganic encapsulating sublayer EN3 in the at least one of the plurality of bridges BR is on a side of the plurality of wires W away from the first inorganic encapsulating sublayer EN1, encapsulating the plurality of wires W in the at least one of the plurality of bridges BR. Optionally, the plurality of wires W is in direct contact with the first inorganic encapsulating sublayer EN1 and the second inorganic encapsulating sublayer EN3.

In some embodiments, the detecting wire is in a peripheral region of a respective one of the plurality of light emitting regions. Referring to FIG. 11, an orthographic projection of a respective one of the plurality of wires W on the flexible base substrate BS at least partially overlaps with an orthographic projection of the pixel definition layer PDL on the flexible base substrate BS. Optionally, the orthographic projection of the pixel definition layer PDL on the flexible base substrate BS covers the orthographic projection of a respective one of the plurality of wires W on the flexible base substrate BS.

Optionally, the second inorganic encapsulating sublayer EN3 has a reduced thickness in the plurality of bridges BR as compared to in the plurality of encapsulated islands IS. By having a reduced thickness, the plurality of bridges BR can have an enhanced flexibility, but still sufficiently encapsulated to protect the plurality of driving wires from external moist and oxygen. Optionally, the reduced thickness of the second inorganic encapsulating sublayer EN3 in the plurality of bridges BR is less than 80% (e.g., less than 70%, less than 60%, less than 50%, less than 40%, less than 30%) of a thickness of the second inorganic encapsulating sublayer EN3 in the plurality of encapsulated islands IS.

Referring to FIG. 10 and FIG. 11, in some embodiments, the encapsulating structure in the plurality of encapsulated islands IS further includes an organic encapsulating sublayer EN2 on a side of the first inorganic encapsulating sublayer EN1 away from the plurality of light emitting elements LE. Optionally, the organic encapsulating sublayer EN2 is on a side of the portion of the respective one of the plurality of wires W in the peripheral regions of the multiple encapsulated islands of the plurality of encapsulated islands IS away from the first inorganic encapsulating sublayer EN1. Optionally, the portion of the respective one of the plurality of wires W in the peripheral regions of the multiple encapsulated islands of the plurality of encapsulated islands IS is in direct contact with the organic encapsulating sublayer EN2.

In another aspect, the present disclosure provides a method of fabricating a flexible display panel. In some embodiments, the method includes forming a plurality of light-emitting regions separated from each other and forming a plurality of dummy regions connecting the plurality of light-emitting regions. Optionally, a respective one of the plurality of light-emitting regions is formed to include a light emitting element and an encapsulating structure encapsulating the light emitting element. Optionally, a respective one of the plurality of light-emitting regions is formed to have a larger thickness than a respective dummy region and include a plurality of driving wires. In some embodiments, the method further includes forming a detecting wire in the plurality of dummy regions and the plurality of light emitting regions. Optionally, the detecting wire is formed in a peripheral region of a respective one of the plurality of light emitting regions. Optionally, the method further includes forming a pixel definition layer on a base substrate to define a subpixel aperture for the light emitting element. Optionally, the detecting wire is formed so that an orthographic projection of the detecting wire in the peripheral region of the respective one of the plurality of light emitting regions on the base substrate at least partially overlaps with an orthographic projection of the pixel definition layer on the base substrate.

In some embodiments, the method includes forming a plurality of light emitting elements on a base substrate, and forming an encapsulating structure encapsulating the plurality of light emitting elements. In some embodiments, the step of forming the encapsulating structure includes forming a detecting wire including a plurality of wires for preventing cracks in the encapsulating structure. Optionally, the step of forming the encapsulating structure further includes forming at least one sublayer, e.g., an inorganic encapsulating sublayer and an organic encapsulating sublayer. Optionally, the detecting wire is formed to be in contact with the at least one sublayer of the encapsulating structure and spanning across at least two inter-light emitting element regions, each of which is between two adjacent light emitting elements of the plurality of light emitting elements. Optionally, the detecting wire is formed to be in contact with at least one inorganic encapsulating sublayer of the encapsulating structure. Optionally, the detecting wire is formed between two inorganic encapsulating sublayers of the encapsulating structure, and formed to be in direct contact with the two inorganic encapsulating sublayers. Optionally, the plurality of wires are a plurality of flexible conductive wires.

In some embodiments, the detecting wire is formed so that a respective one of the plurality of wires continuously extends through a plurality of inter-light emitting element regions, a respective one of which is between two adjacent light emitting elements of the plurality of light emitting elements. Optionally, the method further includes forming two test electrodes respectively connected to the respective one of the plurality of wires for testing connectivity of the respective one of the plurality of wires. For example, the two test electrodes are formed respectively on two opposite sides of the flexible display panel.

In some embodiments, the flexible display panel is a stretchable display panel, and the method includes forming a plurality of encapsulated islands and a plurality of bridges connecting the plurality of encapsulated islands. The encapsulating structure is formed to extend throughout the plurality of bridges and the plurality of encapsulated islands. A respective one of the plurality of encapsulated islands is formed to include at least one of the plurality of light emitting elements encapsulated therein on a base substrate. Optionally, the detecting wire is formed in at least one of the plurality of bridges for enhancing mechanical strength of the at least one of the plurality of bridges.

In some embodiments, the method further includes forming a plurality of driving circuits for driving light emission of the plurality of light emitting elements. Optionally, forming the plurality of driving circuits includes forming a plurality of driving wires passing through the at least one of the plurality of bridges. Optionally, forming the encapsulating structure includes forming a first inorganic encapsulating sublayer extending throughout the plurality of encapsulated islands and the plurality of bridges, encapsulating the plurality of driving wires in the at least one of the plurality of bridges on the base substrate. The detecting wire is formed on a side of the first inorganic encapsulating sublayer away from the base substrate and formed to be in direct contact with the first inorganic encapsulating sublayer. The plurality of driving wires are formed on a side of the first inorganic encapsulating sublayer away from the detecting wire.

Optionally, forming the first inorganic encapsulating sublayer includes forming a first inorganic material layer on the base substrate extending throughout the plurality of encapsulated islands and the plurality of bridges; and reducing a thickness of the first inorganic material layer in the plurality of bridges, thereby forming the first inorganic encapsulating sublayer.

In some embodiments, forming the encapsulating structure further includes forming a second inorganic encapsulating sublayer extending throughout the plurality of encapsulated islands and the plurality of bridges. The second inorganic encapsulating sublayer in the at least one of the plurality of bridges is formed on a side of the detecting wire away from the first inorganic encapsulating sublayer, encapsulating the detecting wire in the at least one of the plurality of bridges. The detecting wire is formed to be in direct contact with the first inorganic encapsulating sublayer and the second inorganic encapsulating sublayer.

Optionally, forming the second inorganic encapsulating sublayer includes forming a second inorganic material layer on the base substrate extending throughout the plurality of encapsulated islands and the plurality of bridges; and reducing a thickness of the second inorganic material layer in the plurality of bridges, thereby forming the second inorganic encapsulating sublayer.

In some embodiments, forming the detecting wire includes forming a respective one of the plurality of wires that continuously extends through multiple bridges of the plurality of bridges connecting multiple encapsulated islands of the plurality of encapsulated islands. Optionally, the method further includes forming two test electrodes respectively connected to the respective one of the plurality of wires for testing connectivity of the respective one of the plurality of wires. Optionally, the respective one of the plurality of wires is formed to extend through the multiple bridges of the plurality of bridges connecting the multiple encapsulated islands of the plurality of encapsulated islands including two encapsulated islands of the plurality of encapsulated islands respectively on two opposite sides of the flexible display panel. Optionally, the respective one of the plurality of wires is formed to pass through peripheral regions of the multiple encapsulated islands of the plurality of encapsulated islands. Optionally, the plurality of wires are formed so that the portion of the respective one of the plurality of wires in the peripheral regions of the multiple encapsulated islands of the plurality of encapsulated islands is in direct contact with the first inorganic encapsulating sublayer, and on a side of the first inorganic encapsulating sublayer away from the plurality of light emitting elements. Optionally, the plurality of driving wires are formed so that a portion of a respective one of the plurality of driving wires in the peripheral regions of the multiple encapsulated islands of the plurality of encapsulated islands is on a side of the first inorganic encapsulating sublayer away from the portion of the respective one of the plurality of wires in the peripheral regions of the multiple encapsulated islands of the plurality of encapsulated islands.

In some embodiments, forming the encapsulating structure further includes forming an organic encapsulating sublayer on a side of the first inorganic encapsulating sublayer away from the plurality of light emitting elements. Optionally, the organic encapsulating sublayer is formed to be limited in the plurality of encapsulated islands. Optionally, the organic encapsulating sublayer is formed on a side of the portion of the respective one of the plurality of wires in the peripheral regions of the multiple encapsulated islands of the plurality of encapsulated islands away from the first inorganic encapsulating sublayer. Optionally, the portion of the respective one of the plurality of wires in the peripheral regions of the multiple encapsulated islands of the plurality of encapsulated islands is in direct contact with the organic encapsulating sublayer.

Various appropriate conductive materials may be used for making the plurality of driving wires. Examples of appropriate conductive materials for making the plurality of driving wires include metals, alloys, graphene, carbon nanotubes, flexible conductive polymers, and other flexible conductive materials.

In some embodiments, the base substrate is a flexible base substrate. Various appropriate flexible materials may be used for making the base substrate. Examples of appropriate flexible materials for making the base substrate include polyimide, polycarbonate, polyethersulfone, polyethylene terephthalate, polyethylene naphthalate, polyarylate, and fiber-reinforced plastic. Optionally, the base substrate is a transparent base substrate. Optionally, the base substrate is a non-transparent base substrate.

In another aspect, the present disclosure provides a flexible display apparatus including a flexible display panel described herein or fabricated by a method described herein. Optionally, the flexible display apparatus further includes one or more integrated circuits connected to the flexible display panel. Examples of appropriate display apparatuses include, but are not limited to, an electronic paper, a mobile phone, a tablet computer, a television, a monitor, a notebook computer, a digital album, a GPS, etc. Optionally, the stretchable display apparatus further includes one or more integrated circuits connected to the stretchable display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A flexible display panel, comprising:
   a base substrate;
   a pixel definition layer on the base substrate and defining a subpixel aperture for a light emitting element;
   a plurality of light-emitting regions separated from each other, a respective one of the plurality of light-emitting regions comprising the light emitting element and an encapsulating structure encapsulating the light emitting element; and
   a plurality of dummy regions connecting the plurality of light-emitting regions, a respective one of the plurality of light-emitting regions having a larger thickness than a respective dummy region and comprising a plurality of driving wires;

wherein the flexible display panel further comprises a detecting wire in the plurality of dummy regions and the plurality of light-emitting regions;
the detecting wire is in a peripheral region of a respective one of the plurality of light-emitting regions; and
an orthographic projection of the detecting wire in the peripheral region of the respective one of the plurality of light-emitting regions on the base substrate at least partially overlaps with an orthographic projection of the pixel definition layer on the base substrate.

2. The flexible display panel of claim 1, wherein the detecting wire is a flexible conductive wire.

3. The flexible display panel of claim 1, wherein the detecting wire continuously extends through a plurality of inter-light emitting element regions, each of which is between two adjacent light emitting elements of a plurality of light emitting elements.

4. The flexible display panel of claim 3, further comprising two test electrodes respectively connected to the detecting wire for testing connectivity of the detecting wire.

5. The flexible display panel of claim 4, wherein the two test electrodes are respectively on two opposite sides of the flexible display panel.

6. The flexible display panel of claim 1, wherein the flexible display panel is a stretchable display panel;
wherein the plurality of light-emitting regions are a plurality of encapsulated islands, and the plurality of dummy regions are a plurality of bridges connecting the plurality of encapsulated islands;
the encapsulating structure extending throughout the plurality of bridges and the plurality of encapsulated islands;
a respective one of the plurality of encapsulated islands comprising at least one of a plurality of light emitting elements encapsulated therein on a base substrate; and
the detecting wire is in at least one of the plurality of bridges for enhancing mechanical strength of the at least one of the plurality of bridges.

7. The flexible display panel of claim 6, further comprising a plurality of driving circuits for driving light emission of the plurality of light emitting elements;
wherein the plurality of driving circuits comprise the plurality of driving wires passing through the at least one of the plurality of bridges;
the encapsulating structure comprises a first inorganic encapsulating sublayer extending throughout the plurality of encapsulated islands and the plurality of bridges;
the first inorganic encapsulating sublayer encapsulates the plurality of driving wires in the at least one of the plurality of bridges on the base substrate;
the detecting wire is on a side of the first inorganic encapsulating sublayer away from the base substrate and in direct contact with the first inorganic encapsulating sublayer; and
the plurality of driving wires are on a side of the first inorganic encapsulating sublayer away from the detecting wire.

8. The flexible display panel of claim 7, wherein the first inorganic encapsulating sublayer has a reduced thickness in the plurality of bridges as compared to in the plurality of encapsulated islands.

9. The flexible display panel of claim 7, further comprising a second inorganic encapsulating sublayer extending throughout the plurality of encapsulated islands and the plurality of bridges;

wherein the second inorganic encapsulating sublayer in the at least one of the plurality of bridges is on a side of the detecting wire away from the first inorganic encapsulating sublayer, encapsulating the detecting wire in the at least one of the plurality of bridges; and
the detecting wire is in direct contact with the first inorganic encapsulating sublayer and the second inorganic encapsulating sublayer.

10. The flexible display panel of claim 9, wherein the second inorganic encapsulating sublayer has a reduced thickness in the plurality of bridges as compared to in the plurality of encapsulated islands.

11. The flexible display panel of claim 6, wherein the detecting wire comprises a plurality of wires; and
a respective one of the plurality of wires continuously extends through multiple bridges of the plurality of bridges connecting multiple encapsulated islands of the plurality of encapsulated islands.

12. The flexible display panel of claim 11, further comprising two test electrodes respectively connected to the respective one of the plurality of wires for testing connectivity of the respective one of the plurality of wires.

13. The flexible display panel of claim 11, wherein the respective one of the plurality of wires extends through the multiple bridges of the plurality of bridges connecting the multiple encapsulated islands of the plurality of encapsulated islands including two encapsulated islands of the plurality of encapsulated islands respectively on two opposite sides of the flexible display panel.

14. The flexible display panel of claim 11, wherein the respective one of the plurality of wires passes through peripheral regions of the multiple encapsulated islands of the plurality of encapsulated islands.

15. The flexible display panel of claim 14, wherein the encapsulating structure in the plurality of encapsulated islands comprises a first inorganic encapsulating sublayer; and
a portion of the respective one of the plurality of wires in the peripheral regions of the multiple encapsulated islands of the plurality of encapsulated islands is in direct contact with the first inorganic encapsulating sublayer, and on a side of the first inorganic encapsulating sublayer away from the plurality of light emitting elements.

16. A flexible display apparatus, comprising the flexible display panel of claim 1, and one or more integrated circuits connected to the flexible display panel.

17. A flexible display panel, comprising:
a plurality of light-emitting regions separated from each other, a respective one of the plurality of light-emitting regions comprising a light emitting element and an encapsulating structure encapsulating the light emitting element; and
a plurality of dummy regions connecting the plurality of light-emitting regions, a respective one of the plurality of light-emitting regions having a larger thickness than a respective dummy region and comprising a plurality of driving wires;
wherein the flexible display panel further comprises a detecting wire in the plurality of dummy regions and the plurality of light-emitting regions;
wherein the encapsulating structure comprises at least two inorganic encapsulating sublayers; and
the detecting wire is in direct contact with one of the at least two inorganic encapsulating sublayers.

18. A flexible display panel, comprising:
- a plurality of light-emitting regions separated from each other, a respective one of the plurality of light-emitting regions comprising a light emitting element and an encapsulating structure encapsulating the light emitting element; and
- a plurality of dummy regions connecting the plurality of light-emitting regions, a respective one of the plurality of light-emitting regions having a larger thickness than a respective dummy region and comprising a plurality of driving wires;
- wherein the flexible display panel further comprises a detecting wire in the plurality of dummy regions and the plurality of light-emitting regions;
- wherein the detecting wire is between two inorganic encapsulating sublayers of the encapsulating structure, the detecting wire being in direct contact with each of the two inorganic encapsulating sublayers.

* * * * *